United States Patent
Yang et al.

(10) Patent No.: US 10,461,712 B1
(45) Date of Patent: Oct. 29, 2019

(54) AUTOMATIC VOLUME LEVELING

(71) Applicant: Amazon Technologies, Inc., Seattle, WA (US)

(72) Inventors: Jun Yang, San Jose, CA (US); Craig McFarland, Alameda, CA (US); Yingbin Liu, Irvine, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 15/714,717

(22) Filed: Sep. 25, 2017

(51) Int. Cl.
| H03G 3/00 | (2006.01) |
| H03G 3/30 | (2006.01) |
| G06F 3/16 | (2006.01) |
| G10L 25/21 | (2013.01) |
| H03G 5/16 | (2006.01) |

(52) U.S. Cl.
CPC ........... *H03G 3/3005* (2013.01); *G06F 3/165* (2013.01); *G10L 25/21* (2013.01); *H03G 5/165* (2013.01)

(58) Field of Classification Search
CPC ........ H03G 1/0088; H03G 3/001; H03G 7/00; H03G 7/001; H03G 7/002; H03G 7/004; H03G 7/005; H03G 7/06; H03G 9/00; H03G 9/005; H03G 9/02; H03G 9/025; H03G 9/14; H03G 9/18; H03G 9/30; H03G 11/00; H03G 11/002; H03G 11/006; H03G 11/008; H03G 11/08; H03G 2201/706; H03G 3/3005; H03G 3/3015; H03G 3/3021; H03G 3/3026; H03G 3/3094; H03G 3/32; H03G 3/34; H03G 3/341; H04R 5/04; H04R 27/02; H04R 2430/01

USPC .......... 381/28, 61, 84, 85, 80, 81, 94.5, 102, 381/103, 104, 106, 107, 108, 109, 120, 381/121, 123; 330/278, 279, 280, 281, 330/282, 284, 294, 302, 307; 455/127.2, 455/127.3, 194.1, 194.2, 232.1, 233.1, 455/234.1, 234.2, 252.1, 253.2, 341; 700/94

See application file for complete search history.

(56) References Cited

U.S. PATENT DOCUMENTS

| 4,583,245 | A  * | 4/1986 | Gelow ................. H04R 3/14 |
| | | | 381/100 |
| 6,757,395 | B1 * | 6/2004 | Fang ................. G10L 21/0208 |
| | | | 381/94.3 |
| 9,685,171 | B1 | 6/2017 | Yang |
| 9,749,741 | B1 | 8/2017 | Yang |
| 2001/0046304 | A1 * | 11/2001 | Rast ................... H04R 1/1041 |
| | | | 381/74 |
| 2006/0140416 | A1 * | 6/2006 | Berg ................... A61F 11/12 |
| | | | 381/72 |
| 2007/0078542 | A1 * | 4/2007 | Alderson ............ G10L 19/26 |
| | | | 700/94 |

(Continued)

Primary Examiner — Leshui Zhang
(74) Attorney, Agent, or Firm — K&L Gates LLP

(57) ABSTRACT

Devices and techniques are generally described for automatic volume leveling of an audio signal. An audio signal may be received and a first portion of the audio signal may be stored in a buffer. A root mean square (RMS) estimate of a level of the first portion of the audio signal may be determined based at least in part on a second portion of the audio signal previous to the first portion. A modified audio signal may be generated by multiplying the first portion of the audio signal in the buffer by a variable gain. The variable gain may be based at least in part on the RMS estimate. The modified audio signal may be sent to a loudspeaker.

20 Claims, 12 Drawing Sheets

(56) References Cited

U.S. PATENT DOCUMENTS

| | | | |
|---|---|---|---|
| 2009/0021640 A1* | 1/2009 | Noh ....................... | H03G 7/007 |
| | | | 348/512 |
| 2013/0156206 A1* | 6/2013 | Tsuji ...................... | H03G 7/007 |
| | | | 381/57 |
| 2014/0044268 A1* | 2/2014 | Herberger ................ | H03G 3/20 |
| | | | 381/56 |
| 2014/0226827 A1* | 8/2014 | Abdollahzadeh Milani ................ | |
| | | | G10L 21/0224 |
| | | | 381/56 |

* cited by examiner

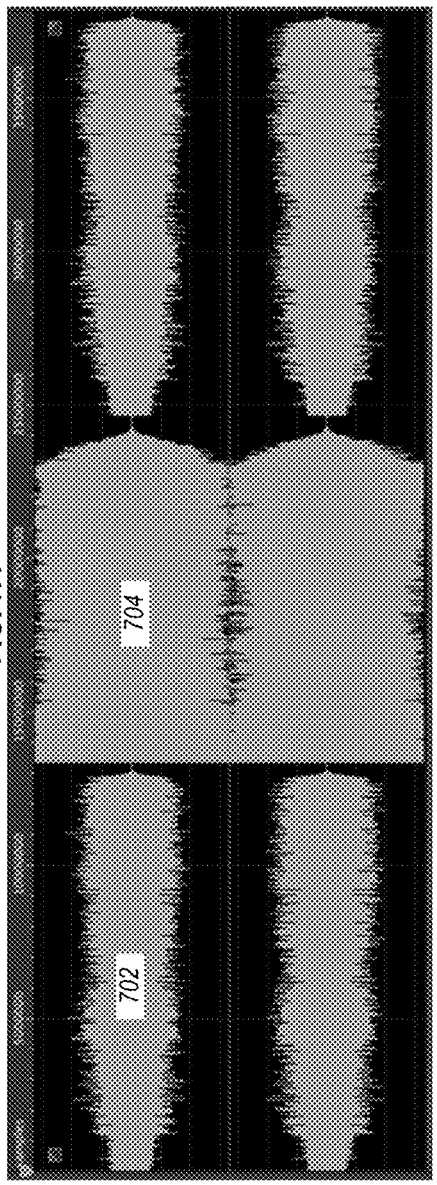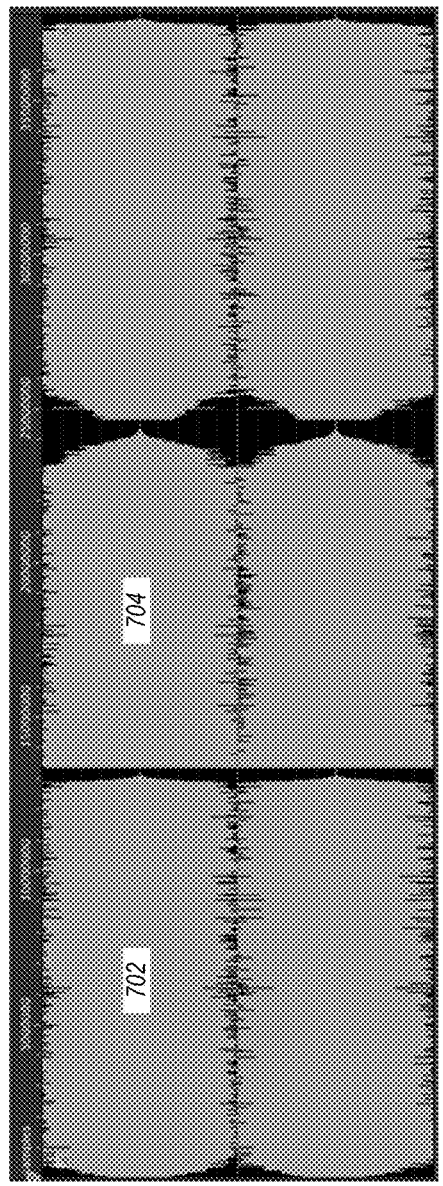

AUTOMATIC VOLUME LEVELING

BACKGROUND

During playback of audio, audio material may have large level changes within a particular song, from one song to another song, and/or from one content provider to another content provider. Dynamic range compression and limiters can compress the dynamic range of signal level (e.g., by reducing the high level signals above a high compression threshold and/or increasing the low level signals below a low compression threshold) to provide for a more consistent listening experience for a user. However, dynamic range compression and limiters can cause "breathing" artifacts (e.g., a rise in the noise floor caused by increasing low level signals) and/or "pumping" artifacts (e.g., a noticeable change in gain within the audio associated primarily with the release of a compressor).

BRIEF DESCRIPTION OF DRAWINGS

FIG. 7A depicts a waveform of raw input audio for input to the various signal processing pathways described herein.

FIG. 7B depicts the waveform of the output audio after performing the various signal processing techniques on the input audio of FIG. 7A, in accordance with various techniques described herein.

DETAILED DESCRIPTION

Figure 1:
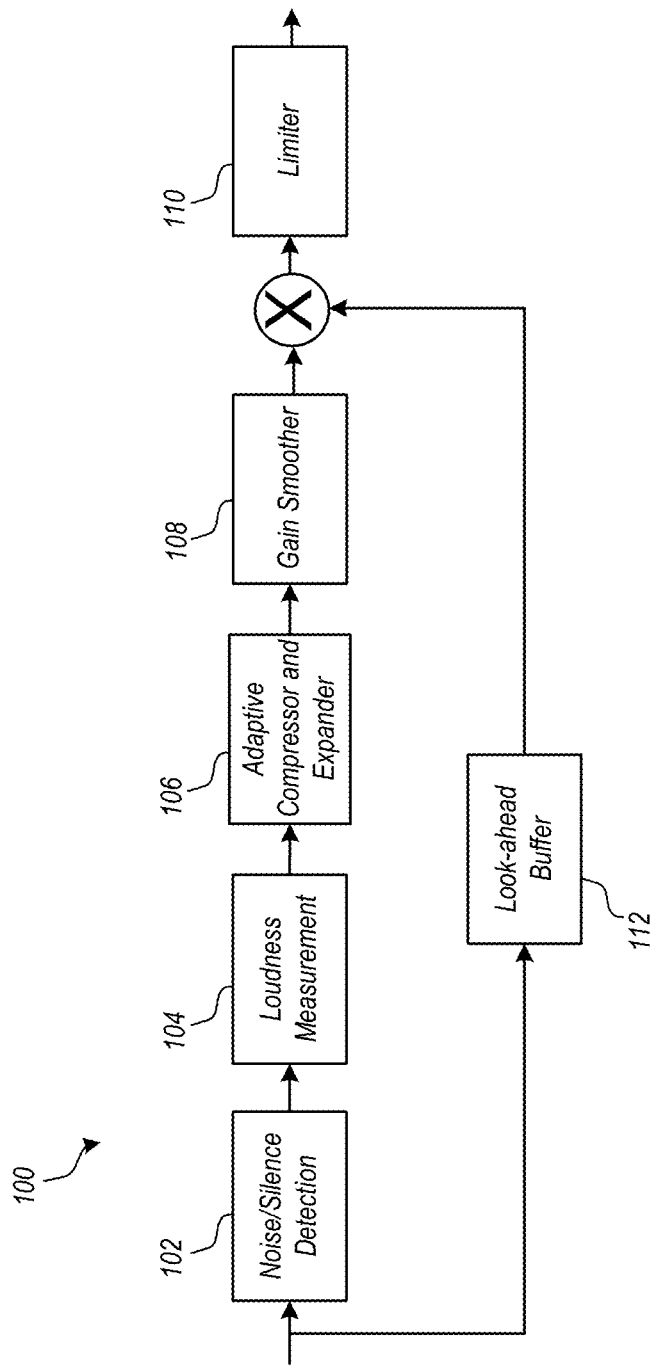
FIG. 1 is a diagram illustrating an example signal processing path for a process of automatic volume leveling, in accordance with various aspects of the present disclosure.

In the following description, reference is made to the accompanying drawings that illustrate several examples of the present invention. It is understood that other examples may be utilized and various operational changes may be made without departing from the spirit and scope of the present disclosure. The following detailed description is not to be taken in a limiting sense, and the scope of the embodiments of the present invention is defined only by the claims of the issued patent.

Various examples described herein are directed to systems and methods for automatic volume leveling ("AVL"). From a system-level processing perspective, the various systems and methods for AVL described herein may extract factors affecting audio performance and apply the corresponding signal processing optimized based on the extracted factors to maximize audio performance and level consistency. For example, based on the particular audio input type and based on the loudspeakers used for playback, the various signal processing techniques described herein may be optimized to simultaneously maximize loudness and minimize distortion, breathing and/or pumping at the maximum volume.

In various examples, the systems and methods described herein may be used with speakers comprising an embedded system including at least one processor and a non-transitory, computer-readable memory. In various examples, the at least one processor may be effective to perform the various processing techniques described herein. In various examples, such speakers may sometimes be referred to as "smart speakers". In various examples, the speakers described herein may be effective to communicate over a network (e.g., the internet, a local area network, etc.) with one or more other computing devices and/or one or more other smart speaker systems. Further, in at least some examples, the speakers described herein may comprise an automatic speech recognition (ASR) capability. In some other examples, the speakers described herein may be configured to be in communication with an ASR-enabled device.

The speakers described herein may be effective to playback different types of audio. For example, the speakers described herein may be able to playback music, text to speech (TTS), alarms, voice over IP (e.g., voice calls), timers, etc. In an example using an ASR-enabled device that may include and/or be in communication with a speaker, a user may speak a "wake-word" that may be a spoken, audible command. A wake-word may be, for example, a word or phrase for which a wake-word engine of the ASR-enabled device continually listens. A microphone and/or microphone array of the ASR-enabled device may detect the spoken wake-word and, in response, subsequent audio captured by the microphone and/or microphone array will be processed to detect further audible commands and/or the subsequent audio received by the microphone of the ASR-enabled device may be transmitted to one or more voice recognition servers. In the example, a user may "wake" the ASR-enabled device to further voice commands using the wake-word, and may thereafter speak an audible command for the ASR-enabled device to play a particular song. Similarly, a user may speak an audible command for the ASR-enabled device to read a news article (e.g., requesting TTS playback). Audio may be transmitted/streamed from the ASR-enabled device over a network to one or more voice recognition servers in any audio file format, such as mp3, mp4, or the like. The one or more voice recognition servers may receive the transmitted or streamed audio. Upon determining that the audio content has reached an endpoint, the one or more voice recognition servers may analyze the received audio stream and may translate the audio stream into natural language. The one or more voice recognition servers may determine whether or not the natural language corresponds to a command. If so, the one or more voice recognition servers may send the command over a network to one or more other computing devices to execute the command.

For example, a user may speak the command, "Play rock music" to the ASR-enabled device after waking the ASR-enabled device with a wake-word. The ASR-enabled device may transmit the voice command to the one or more voice recognition servers. The one or more voice recognition servers may analyze the audio stream and may translate the audio stream into natural language. The one or more voice recognition servers may determine that the natural language "Play rock music" corresponds to a command effective to request rock music be played by an online music streaming service to which a user of the ASR-enabled device has access. The one or more voice recognition servers may send the command over a network to a computing device of the online music streaming service. The command may be effective to cause the online music streaming service to stream rock music (e.g., a rock music playlist or compilation) over a network to the ASR-enabled device. The ASR-enabled device may receive the stream and may output the rock music through the speaker.

FIG. 1 is a diagram illustrating an example signal processing path for a process 100 of automatic volume leveling, in accordance with various aspects of the present disclosure. Process 100 may receive an audio signal as an input and may determine an adaptive gain for the audio signal to generate a consistently leveled audio signal for playback without breathing and pumping artifacts. The various processing blocks of FIG. 1 are briefly introduced here and are discussed in further detail below. At block 102 of process 100 noise and silence detection may be performed to determine whether a portion of the input audio signal constitutes noise or silence. At block 104 a loudness of the input audio signal may be measured as an root mean square (RMS) estimate of the input audio signal volume. At action 106 an adaptive gain is determined for the input audio signal based on the RMS estimate of the input audio signal volume. At action 108, the gain is smoothed using equation (3), below to provide smooth transitions in the gain of the input audio signal. At action 112, the input audio signal is delayed and stored in a look-ahead buffer. The gain determined at action 106 and smoothed at action 108 is multiplied by the delayed signal. The resulting modified input audio signal is limited at action 110 to prevent clipping.

Figure 2A:
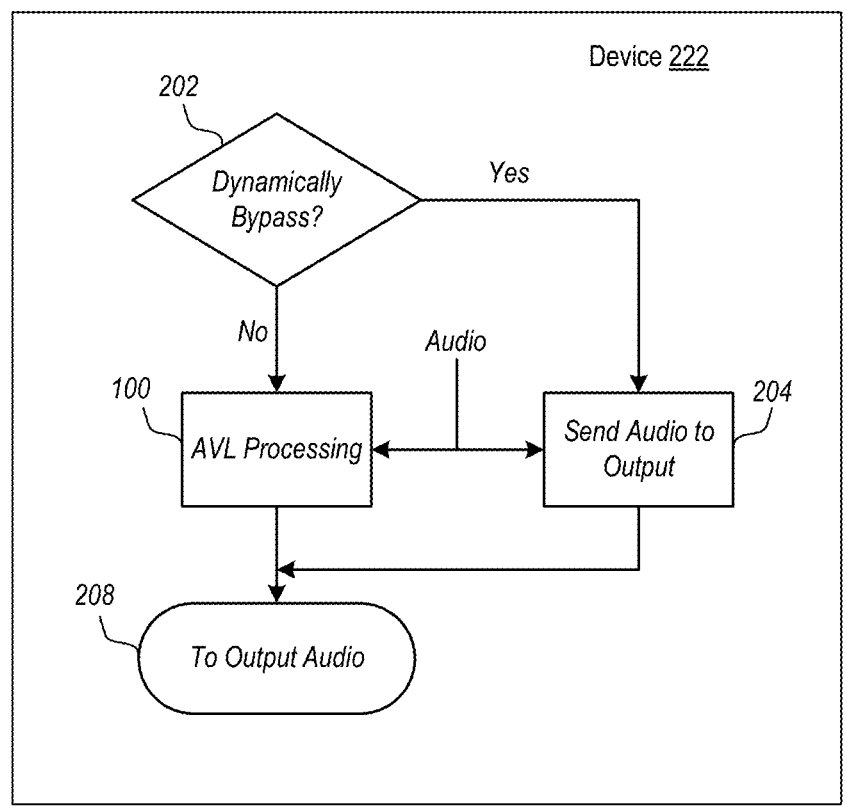
FIG. 2A illustrates an example process for determining whether or not the automatic volume leveling techniques described herein should be bypassed, in accordance with various embodiments of the present disclosure.

FIG. 2A illustrates an example process for determining whether or not the automatic volume leveling ("AVL") techniques of FIG. 1 should be performed or bypassed, in accordance with various embodiments of the present disclosure. The various actions depicted herein, including AVL process 100, may be performed by a device 222. In some examples, device 222 may be a smart speaker or some other computing device. Device 222 may include at least one processor and a memory (not shown in FIG. 2A). In various examples, input audio may be sent directly to output without employing the various AVL techniques described herein. Accordingly, at action 202, a determination may be made whether or not the input audio signal should be sent directly to output (e.g., action 204) or should proceed to the AVL process 100. The determination may be made based on the particular input audio type. In various examples, the input audio type may be denoted in an audio front end (AFE) of the speaker systems described herein by a flag or other indicator data.

In various examples, one or more of the following flags (e.g., indicator data) may be used by the systems and methods described herein: an "inPlayback" flag, an "inTTS" flag, an "inVoiceCall" flag, an "inAlarm" flag, an "inTimer" flag, and a "VolumeAttenuated" flag. An "inPlayback" flag being set to a logic value "true" may indicate that the input audio is a music signal and that the speaker is currently playing back music. Similarly, an "inTTS" flag set to true may indicate that the input audio is a text to speech signal and that the speaker is currently playing back the text to speech. An "inVoiceCall" flag set to true may indicate that the input audio is a voice call signal (e.g., the input audio is a two-way conversation as well as microphone echo received by a microphone associated with the speaker). An "inAlarm" flag set to true may indicate that the input audio is an alarm signal. An "inTimer" flag set to true may indicate that the input audio is a timer signal (e.g., a countdown and/or a voice stating the amount of time remaining). A "VolumeAttenuated" flag may indicate that any playback (including music, TTS, voice calls, etc.) has been attenuated (e.g., a playback-attenuated or volume-attenuated signal). In various examples, the audio input may be attenuated in response to a detected wake-word in an ASR-enabled device. After a command is recognized or after an expiration of a predefined amount of time during which no command is detected by a speech recognition component of the ASR-enabled device, the "VolumeAttenuated" flag may be set to "false" and playback of any previous audio may resume.

For example, a user may utter a wake-word causing the "VolumeAttenuated" flag to be set to true and playback of music to pause or otherwise be attenuated. Thereafter, the user may make a request, such as "What time is it?" After acquiring the answer to the query using the voice recognition servers, the response (e.g., "It is 11:00 am") may be played as TTS. When the TTS response is played the "VolumeAttenuated" flag is set to false and the "inTTS" flag is set to true. In various examples, after playback of the response, the music playback may resume, setting the "inTTS" flag to false and the "inPlayback" flag to true.

At action 202 of FIG. 2A, a determination may be made whether or not the input audio signal should be sent directly to output (e.g., action 204) or should proceed to AVL process 100 based on the playback flags described above. In some examples, the input audio signal may be sent directly to output, bypassing AVL process 100, if one or more of the "inAlarm" flag and the "inTimer" flag are set to true. Further, in some examples, the input audio signal may be sent directly to output, bypassing AVL process 100, if both the "inPlayback" flag and the "VolumeAttenuated" flag are set to true. Similarly, in some examples, the input audio signal may be sent directly to output, bypassing AVL process 100, if both the "inTTS" and "VolumeAttenuated" flag are set to true. Similarly, in some examples, the input audio signal may be sent directly to output, bypassing AVL process 100, if both the "inVoiceCall" and "VolumeAttenuated" flag are set to true.

If a determination is made at action 202 that AVL process 100 should not be bypassed, processing may proceed to AVL process 100. As described in further detail below, AVL may maximize audio performance and level consistency while minimizing unwanted distortion, breathing and/or pumping at any volume. In order to perform the various AVL processing techniques described herein, the input audio type may be used to determine an actual volume in dB from a volume index table that corresponds to the particular input audio type.

Figure 2B:
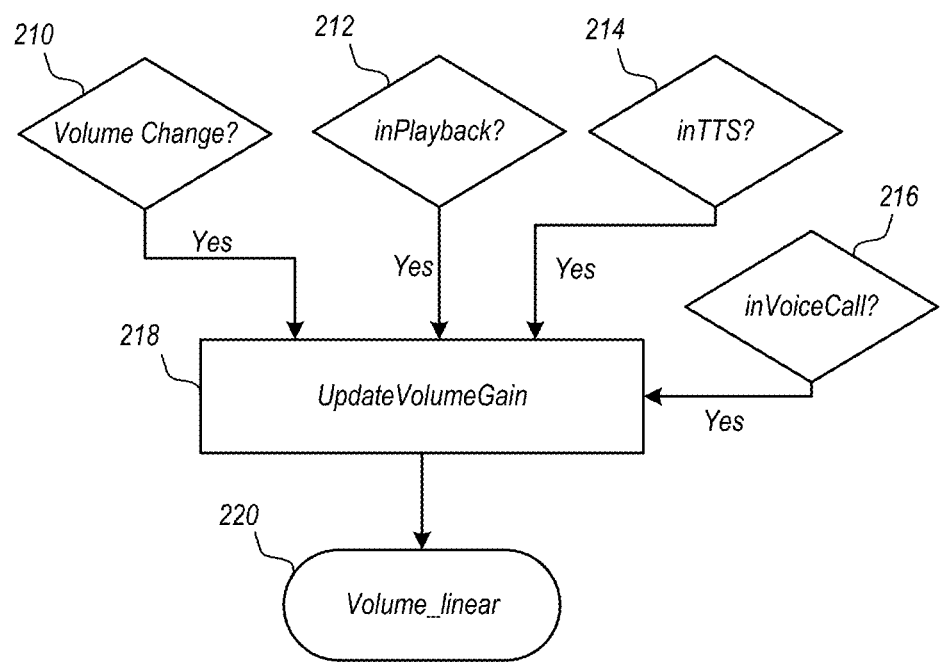
FIG. 2B depicts a pre-processing stage for automatic volume leveling used to determine an updated volume for a particular input audio type, in accordance with various aspects of the present disclosure.
Figure 2C:
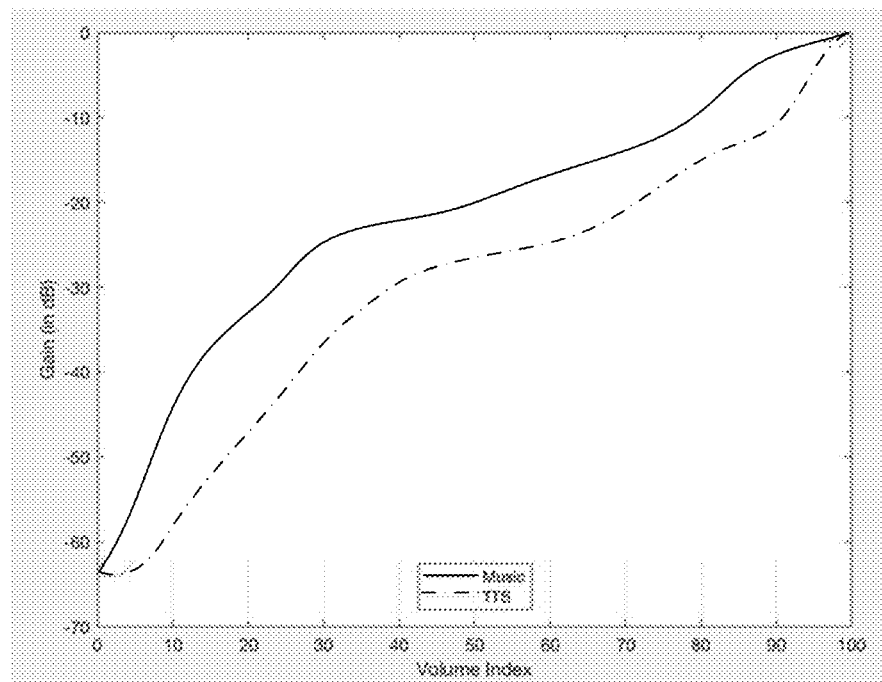
FIG. 2C depicts a volume index table illustrating gain curves over different volume indexes for two different input audio types, in accordance with various aspects of the present disclosure.

For example, FIG. 2C depicts a volume index table with two volume curves—one volume curve for music and another volume curve for TTS. The volume index values represent volume indexes for a particular type of loudspeaker. Volume index values are values associated with a particular loudspeaker or audio device that correspond to a particular gain for a given audio type for that loudspeaker or audio device. Volume index values are often provided as selectable values for a user of a powered speaker as a proxy for providing the actual gain values. Accordingly, in an example, a particular powered speaker may include selectable volume indexes ranging from 0 (minimum volume or mute) to 10 (maximum volume). In some examples, volume indexes may be empirically determined based on user feedback for a particular speaker. Volume index tables may be stored in a memory of the smart speaker. The volume index values are for exemplary purposes only and any volume index values may be used including and apart from what is shown in FIG. 2C. As depicted in FIG. 2C, for a given volume index value of 20 the actual volume (e.g., the input gain (in dB)) is about −50 dB for TTS and about −35 dB for music. In various examples, the volume curves may be stored as tables or other data structures in a memory of the computing device performing the various automatic leveling techniques described herein.

FIG. 2B depicts a pre-processing stage for AVL used to determine an updated volume for a particular input audio type, in accordance with various aspects of the present disclosure. Depending on the input audio flags passed to the audio front end the pre-processing stage depicted in FIG. 2B may determine an updated volume gain for the particular input audio type at action 218. The updated volume gain may be used to determine a current volume at action 220. The current volume may be referred to herein as "Volume_linear". For example, at determination step 212, a determination may be made whether the particular input audio type is music playback. If so, at action 218 the gain (in dB) may be obtained from a music table similar to the table depicted in FIG. 2C. For example, a processor of the smart speaker or other device performing the various processing steps described herein may perform a lookup of a music_table by using the volume index value to perform a lookup on the music table (e.g., volume_dB=music_table(index)).

Similarly, at determination step 214, a determination may be made whether the particular input audio type is TTS. If so, at action 218, the gain (in dB) may be obtained from a TTS table similar to the table depicted in FIG. 2C. For example, a processor of the smart speaker or other device performing the various processing steps described herein may perform a lookup of a tts_table by using the volume index value to perform a lookup on the TTS table (e.g., volume_dB=tts_table(index)).

Similarly, at determination step 216, a determination may be made whether the particular input audio type is a voice call. If so, at action 218, the gain (in dB) may be obtained from a voice call table similar to the table depicted in FIG. 2C. For example, a processor of the smart speaker or other device performing the various processing steps described herein may perform a lookup of a VoiceCall_table by using the volume index value to perform a lookup on the voice call table (e.g., volume_dB=VoiceCall_table(index)).

Similarly, if a new volume index has been selected (e.g., by a user turning up or down the volume of the smart speaker) at action 210, at action 218, the gain may be obtained from the appropriate lookup table by passing the newly selected volume index value to the appropriate lookup table for the particular input audio type.

An example algorithm for determining the appropriate input audio type at determination steps 212, 214 and/or 216 (and thus the appropriate audio input lookup table to use at action 218) is now provided. The example below represents one possible implementation for determining the currently active input audio type. However, other methods are possible in accordance with the various automatic volume leveling techniques described in the present disclosure.

Step 1—If inPlayback flag is true, volume_dB=Music_table(index);
   else if inVoiceCall flag is true, volume_dB=VoiceCall_table(index);
Step 2—If inTTS flag is true, volume_dB=TTS_table (index).

After determining the updated volume gain for the particular input audio type at action 218 using the various methods described above, the volume_linear may be determined using equation (1):

$$\text{volume\_linear}=\exp(10.0,\text{volume\_dB}/20.0) \quad (1)$$

Figure 3A:
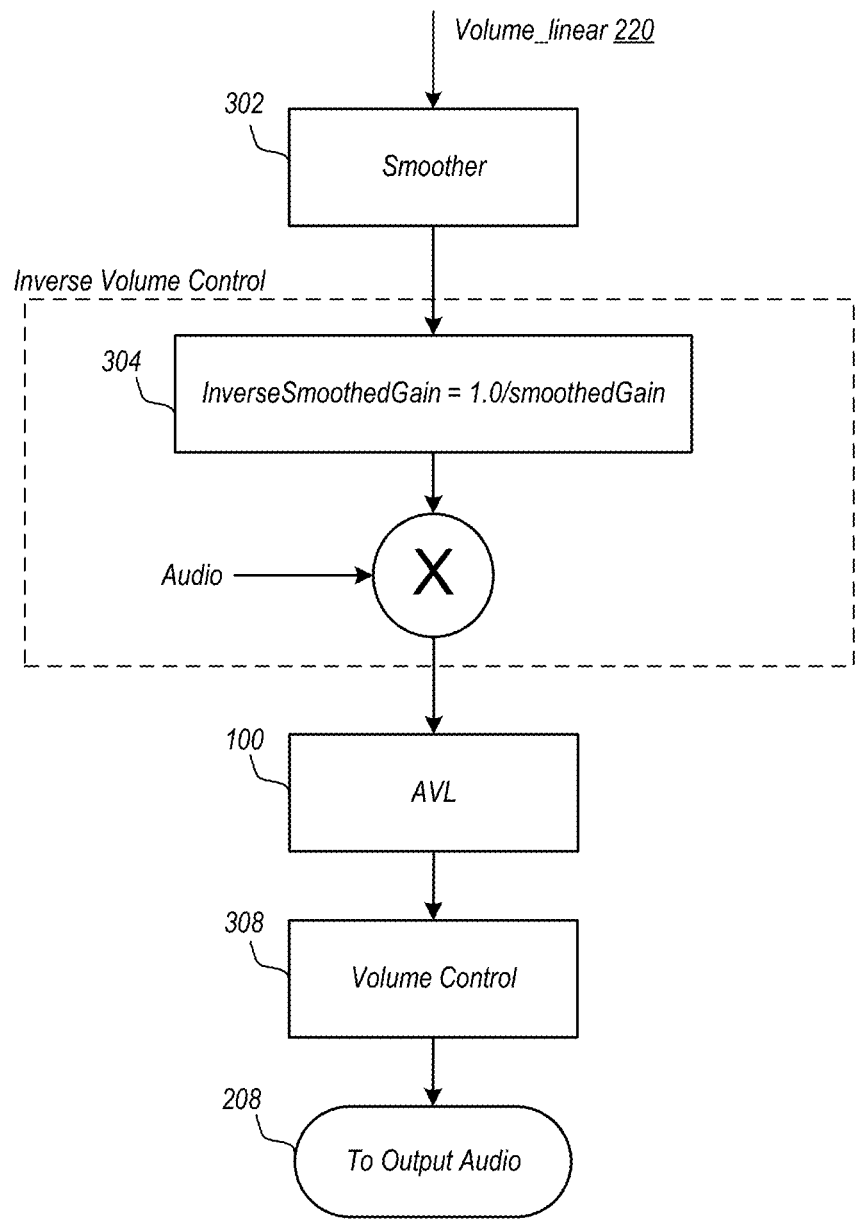
FIG. 3A is a diagram illustrating an example signal processing path for automatic volume leveling for devices effective to process incoming audio using volume control, in accordance with various aspects of the present disclosure.
Figure 3B:
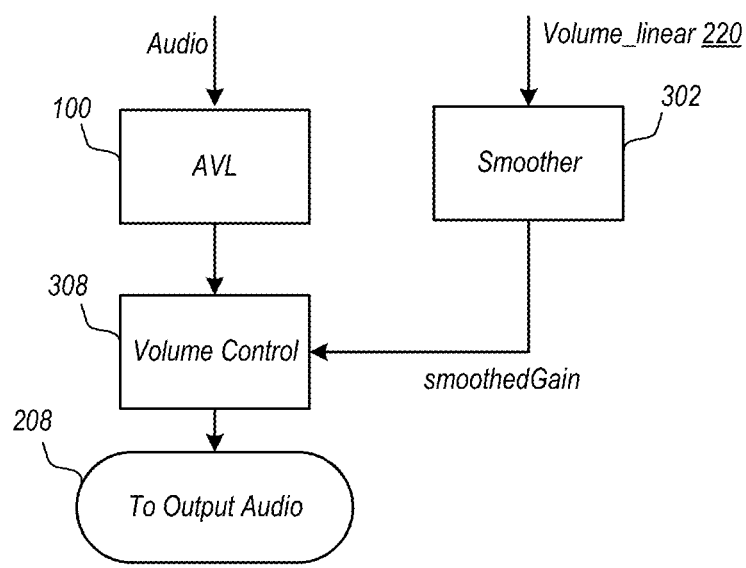
FIG. 3B is a diagram illustrating an example signal processing path for automatic volume leveling where the incoming audio has not been processed using volume control, in accordance with various aspects of the present disclosure.

FIG. 3A is a diagram illustrating an example signal processing path for automatic volume leveling for devices effective to process incoming audio using volume control, in accordance with various aspects of the present disclosure. FIG. 3B is a diagram illustrating an example signal processing path for automatic volume leveling where the incoming audio has not been processed using volume control, in accordance with various aspects of the present disclosure. Accordingly, the AVL techniques described herein may be used with any type of speaker whether or not incoming audio has been processed using volume control.

The block 302 of FIGS. 3A and 3B is used to smooth the volume change to prevent drastic volume transitions when the volume is adjusted during playback. The smoothing operation of block 302 may be implemented using the following algorithms:

$$\text{smoothedGain}(0)=\text{smoothedGain}(0)+\text{smoothFactor}* \\ (\text{volume\_linear}-\text{smoothedGain}(0));$$

$$\text{smoothedGain}(i)=\text{smoothedGain}(i)+\text{smoothFactor}* \\ (\text{smoothedGain}(i-1)-\text{smoothedGain}(i)); \text{ for } i=1, \\ 2, \ldots, N-1$$

where the N is the number of audio samples in a frame. The smoothFactor may range from 0.0 to 1.0 and may be a tunable parameter used to control the transition between different volume levels/indexes. In various examples, volume_linear 220 may be determined using the process described above in reference to FIG. 1B. Volume_linear 220 may be an input to the smoothing operation performed at block 302.

Block 304, the "InverseSmoothedGain=1.0/smoothedGain" block in FIG. 3A may be implemented by:

$$\text{InverseSmoothedGain}(i)=1.0/\text{smoothedGain}(i) \text{ for} \\ i=0,1,2,\ldots,N-1$$

Inverse volume control in FIG. 3A may be used to counteract previous volume control processing so that one setting (or group of settings) of AVL process 100 may be used for any product regardless of whether or not upstream volume control processing is performed prior to performing AVL process 100. As depicted in FIGS. 3A and 3B volume control 308 may be performed post AVL process 100 prior to outputting the audio to the speaker at action 208 to provide volume control of the audio signal as modified by AVL process 100. AVL process 100 is described in further detail below.

Referring again to FIG. 1, a diagram is shown illustrating an example signal path for a process 100 of automatic volume leveling, in accordance with various aspects of the present disclosure. Depending on the type of device in which AVL is implemented the signal processing path in process 100 may receive an input audio signal as shown in FIGS. 3A, 3B.

Figure 4:
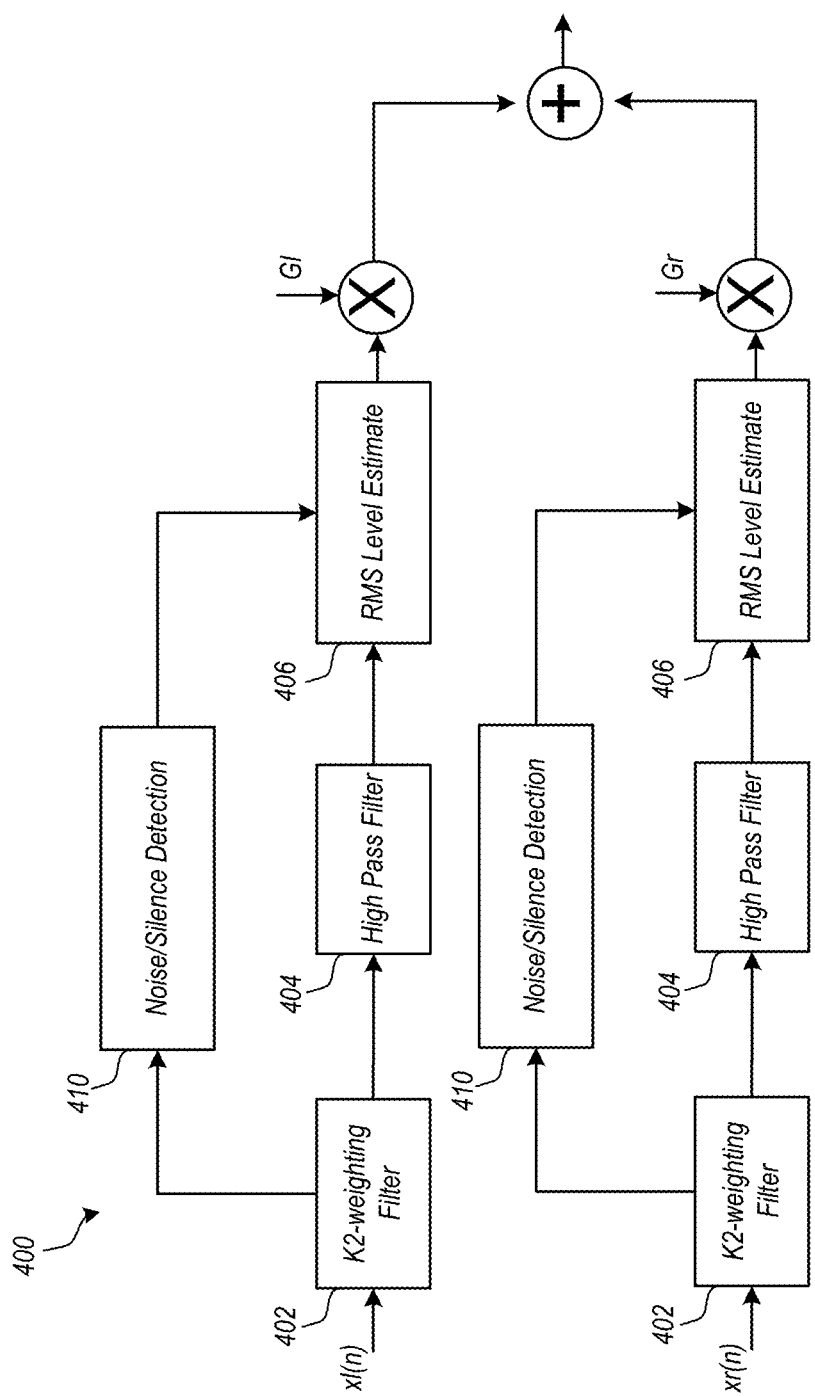
FIG. 4 is a diagram depicting an example of the noise/silence detection processing and loudness measurement of the process shown in FIG. 1, in accordance with various aspects of the present disclosure.

At block 102 of AVL process 100 noise and silence detection may be performed. FIG. 4 is a diagram depicting an example of the noise/silence detection processing and loudness measurement of the process 100 shown in FIG. 1 (e.g., blocks 102 and 104 of FIG. 1), in accordance with various aspects of the present disclosure. Although the example depicted in FIG. 4 shows a signal processing scheme for stereo audio, any number of channels may be used (e.g., mono, stereo, 5.1 channels and 7.1 channels) in accordance with the various techniques described herein. The noise/silence detection process 400 may be performed in order to avoid reduction of a signal-to-noise SNR ratio of the input audio signal. If noise or silence is detected, the RMS loudness estimate generated by the process depicted in FIG. 4 may be set to the previous value in order to avoid increasing the gain when silence or noise are detected, causing breathing and/or pumping artifacts. Note that the processes described in FIGS. 1 and 4 may be performed on blocks of samples, as opposed to on individual samples.

The process 400 of FIG. 4 may begin at block 402, at which a K2-weighting filter is applied to the input audio signal. The K2-weighting filter is defined by an International Telecommunication Union ("ITU") standard. Although the K2-weighting filter is used at block 402, other linear or non-linear filters (or combinations thereof) may be used instead of the K2-weighting filter, in accordance with the various techniques described herein. In the stereo example depicted in process 400 of FIG. 4, a left channel audio signal $x1(n)$ (e.g., the top signal processing path) and a right channel audio signal xr(n) (e.g., the bottom signal processing path) are depicted. However, as previously described, any number of channels may be used and the stereo processing depicted in FIG. 4 is merely an illustrative example.

The K2-weighting filter at block 402 may be, for example, a second order infinite impulse response (IIR) filter with a cutoff frequency of about 100 Hz. At block 404 the audio signal may be subjected to a high pass filter (HPF). The HPF may be used to improve the accuracy of loudness estimation. Accordingly, the cutoff frequency of the HPF may be set based on the particular loudspeaker being used to output the audio signal. In various examples, the cutoff frequency of the HPF at block 404 may be set to 50 Hz, 60 Hz, 300 Hz, 500 Hz, or any other value, depending on the particular loudspeaker(s) being used.

The output of the high-pass filtered signal from block 404 proceeds to block 406. At block 406 an RMS level estimate of the audio signal is calculated from equation (2):

$$x^2_{rms}(n)=(1-k)\cdot x^2_{rms}(n-1)+k\cdot [x(n)]^2 \qquad (2)$$

where $x^2_{rms}(n-1)$ represents the previous RMS level estimate, x(n) is the audio input to block 406, factor k=1−exp(−2.2/(fs*t/1000)) where t is the time constant in milliseconds (e.g., 100 ms), and fs is the sampling rate. If, at block 406, noise or silence is detected for the current block at block 410, the RMS level estimate may be set to the previous block's (or portion's) value of $x^2_{rms}(n-1)$ (e.g., the previously sampled portion of the input audio signal). Accordingly, in FIG. 1 no adaptation may be generated for the noise/silence block by the adaptive compressor and expander block 106.

At block 410, a determination may be made whether or not a block represents silence or noise. In various examples, if the energy level of a block of samples is below a threshold amount of energy, the block may represent silence or noise. In various other examples, a fast-attack and slow-release network (e.g., compressor) may be used to estimate the envelope of the audio signal. A slow-attack and fast-release network may be used to estimate the noise floor. A ratio between the estimated envelope and noise floor may be used to quantify noise. When the calculated ratio (e.g., signal-to-noise ratio) is below a second threshold, the audio block may represent silence or noise. Other techniques for detecting and/or quantifying silence and/or noise are known in the art and may be used in accordance with the present disclosure.

Returning to FIG. 1, the RMS level estimate generated using process 400 may be provided to block 106, "Adaptive Compressor and Expander". The output of block 106 is an adaptive gain to be applied to the delayed audio signal block, delayed and stored in a look-ahead buffer at action 112. As previously described, if the audio block is determined to correspond to noise or silence at block 102, the RMS level estimate may be set to the value of the previous audio block. Accordingly, the adaptive gain may not be updated in such a scenario.

Figure 5:
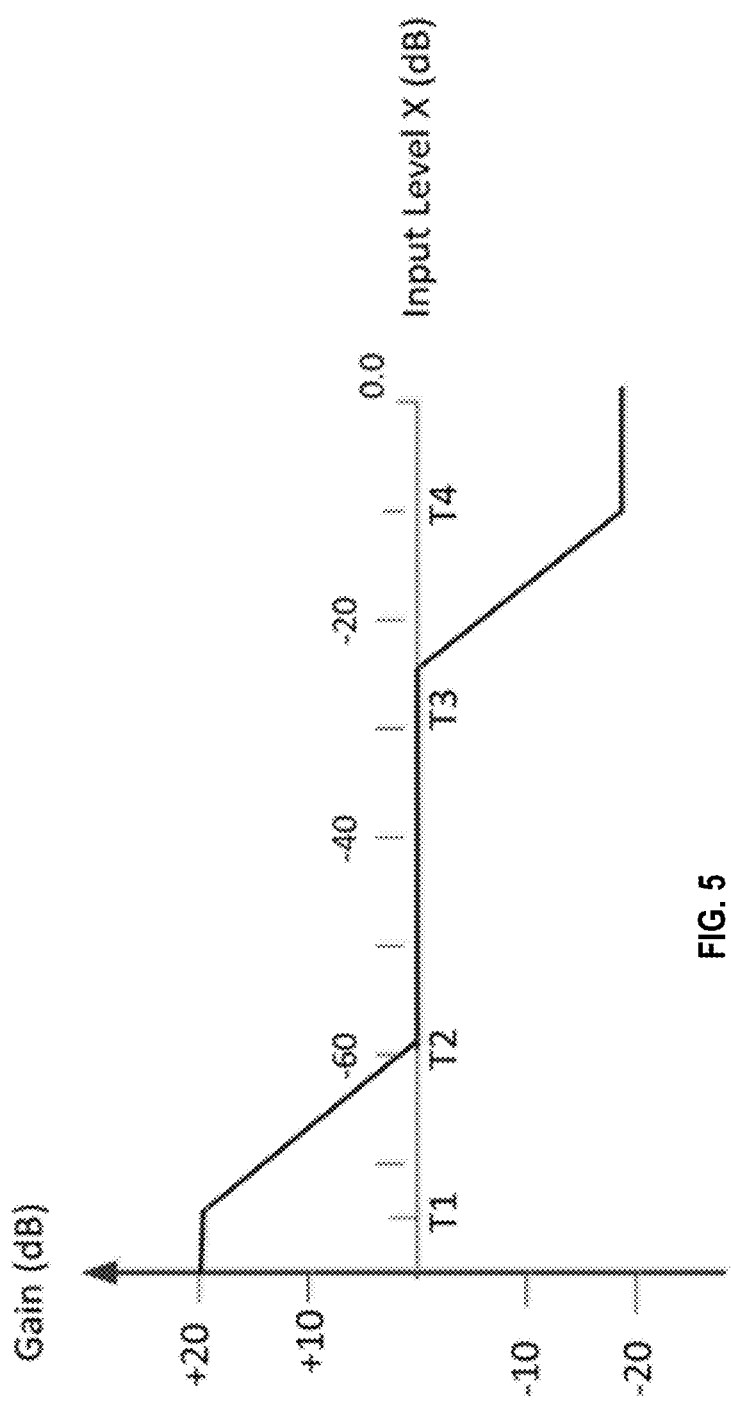
FIG. 5 is a diagram depicting a static level curve of input level versus gain that may be used to determine an adaptive gain for an audio signal, in accordance with various aspects of the present disclosure.

FIG. 5 is a diagram depicting a static level curve of input level versus gain that may be used to determine an adaptive gain for an audio signal (e.g., block 106 of FIG. 1), in accordance with various aspects of the present disclosure. In various examples, the graphical depiction of the static level curve of input level versus gain in FIG. 5 may be instituted as a lookup table, a gain determination function and/or as another data representation used to associate various gains with input levels of an input audio signal, according to the various automatic volume leveling techniques described herein.

In the example depicted in FIG. 5, an input level (e.g., the RMS level estimate from block 104 of FIG. 1) may be used to determine an adaptive gain. In various examples, the adaptive gain determination depicted in FIG. 5 may be instituted as a lookup operation. In the example static level curve depicted in FIG. 5, there are four input level thresholds. The order from smallest threshold to largest threshold is: T1<T2≤T3<T4<0.0 dB. Block 106 of FIG. 1 ("Adaptive Compressor and Expander") may operate as follows. When the RMS estimate input level is less than T1, a linear amplification may be applied with a constant positive gain, as depicted in FIG. 5. When the RMS estimate input level is between T1 and T2, an expander function is applied to increase changes in the input level to larger changes in the output level (e.g., the linearly decreasing amount of gain depicted between T1 and T2). When the RMS estimate input level is between T2 and T3, the output level may remain the same as input level. In other words, the Gain=1.0=0.0 dB (e.g., a unity gain). When the RMS estimate input level is between T3 and T4, a compressor function may be applied to reduce the change of input level to a smaller change in the output level (e.g., the linearly increasing amount of negative gain depicted between T3 and T4). When the RMS estimate input level is larger than T4, a linear attenuator function may be applied with a constant negative gain. In various examples, the thresholds T1, T2, T3, and/or T4 as well as the gain profiles between the thresholds may be adjusted based on the type of audio. Additionally, different static level curves may be stored in memory for different types of audio. For example, a static level curve for TTS may have a reduced unity gain region (e.g., the region between T2 and T3 in FIG. 5) as TTS may be more heavily compressed relative to other forms of audio, such as music. In another example, a static level curve for music playback may have a larger unity gain region during music playback so that a user can hear a more dynamic range of the audio signal. In various examples, users may be able to adjust the gain profiles of the stored static level curves in order to tailor the playback experience according to the user preferences. As previously described, the input audio type may be denoted in the AFE of the speaker systems by a flag or other indicator data. As such, in various examples, a static level curve corresponding to the type of input audio (as indicated by the flag or other indicator data) may be used to determine the adaptive gain for a portion of the input audio signal in accordance with various techniques described herein.

Returning to FIG. 1, block 108 may be used to reduce the variation of and smooth the gain determined from Adaptive Compressor and Expander block 106. The final gain may be given by equation (3):

$$g(n)=a*g(n-1)+(1-\alpha)*\text{gain} \quad (3)$$

where α is a smoothing factor between 0.0 and 1.0 and g(n−1) is a previous gain of the portion of the input audio signal.

Multiplying the delayed input signals (stored in the look-ahead buffer at action 112) by the final gain g(n) sample-by-sample (and/or block by block) the output loudness may be well balanced and consistent. Delaying the input signal and multiplying it with the control signal g(n) allows predictive level control as the gain may be reduced prior to drastic increases in volume level. After applying the final gain g(n) to the delayed inputs, an action 110 may be deployed to limit the signal to prevent the system output from clipping so as to avoid artifacts. The limiter may include a threshold power and may pass signals below the threshold power while attenuating peaks of signals that exceed the power threshold.

Figure 6:
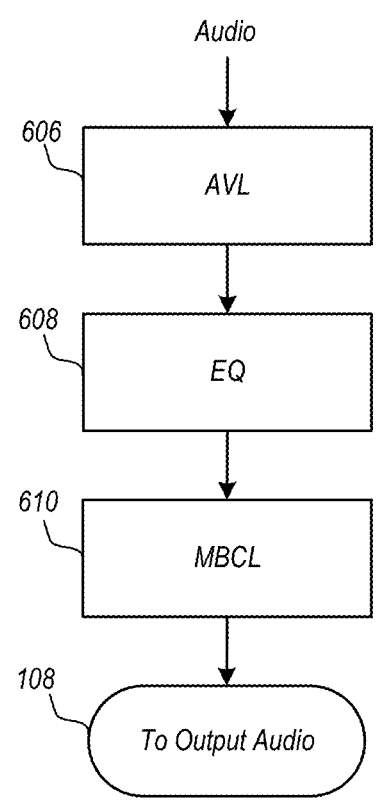
FIG. 6 is a flow diagram illustrating an order of audio processing blocks to maximize audio performance, in accordance with various aspects of the present disclosure.

FIG. 6 is a flow diagram illustrating an order of audio processing blocks to maximize audio performance, in accordance with various aspects of the present disclosure. Equalization ("EQ") is designed to compensate for loudspeaker frequency response. Accordingly, the EQ may be tailored to the particular loudspeaker(s). For example, for a particular loudspeaker, the a reduction in the audio level may be needed in one or more frequency ranges. As depicted in FIG. 6, the EQ processing 608 is performed after AVL 606 to improve audio performance. Multi-band compressor-limiter (MBCL) technology may be employed at action 610 to further process the audio signal following AVL 606. MBCL is described in, for example, issued U.S. Pat. No. 9,749,741, the disclosure of which is incorporated by reference herein. Post MBCL processing, the audio signal may be sent to output audio at action 108.

FIG. 7A depicts a waveform of raw input audio for input to the various signal processing pathways described herein. FIG. 7B depicts the waveform of the output audio after performing the various signal processing techniques on the input audio of FIG. 7A, in accordance with various techniques described herein. They axis in FIGS. 7A and 7B represents the amplitude of the signals. As depicted in FIG. 7A, a first portion of the audio 702 and a second portion of the audio 704 exhibit a loudness difference of about 8.88 loudness units relative to full scale (LUFS). As depicted in FIG. 7B, after using AVL and the various other audio processing techniques described herein, the loudness difference between portions 702 and 704 is about 1.12 LUFS. Accordingly, the automatic volume leveling techniques described herein has improved the audio level consistency by 7.76 LUFS without increasing artifacts or distortion.

Figure 8:
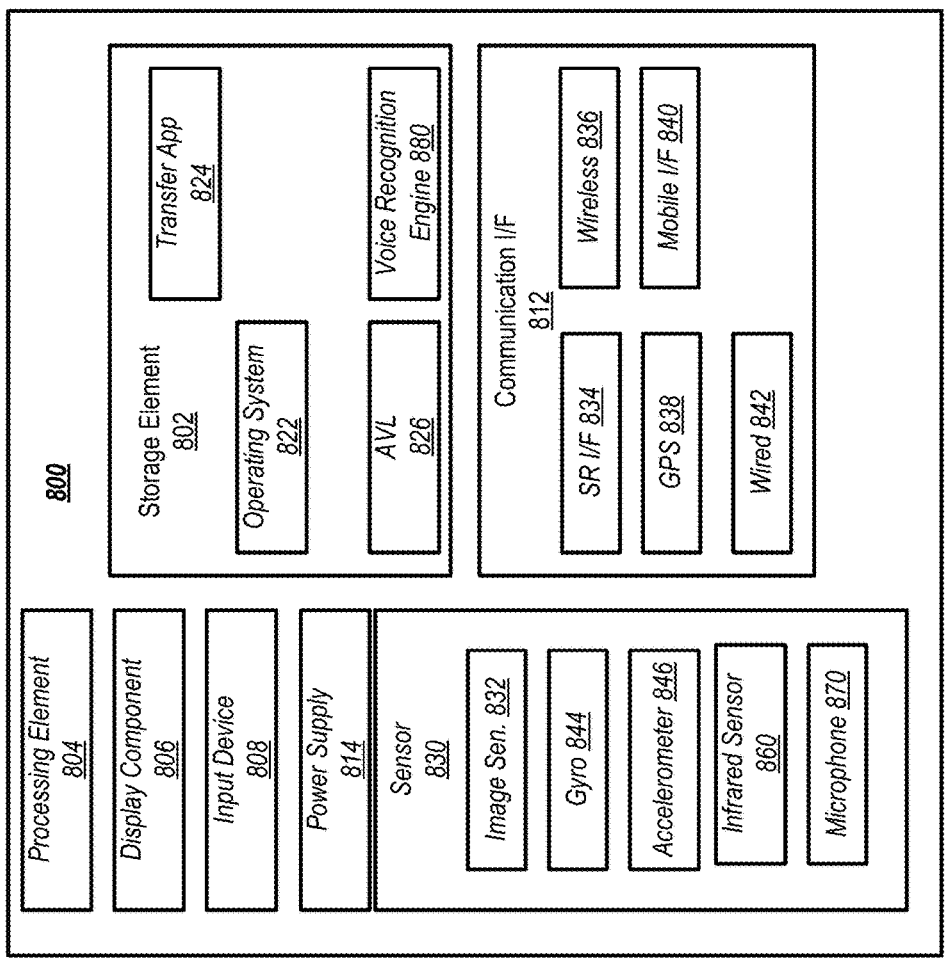
FIG. 8 is a block diagram showing an example architecture of a computing device in which the automatic volume leveling system described in the present disclosure, or a portion thereof, may be implemented, in accordance with various embodiments described herein.

FIG. 8 is a block diagram showing an example architecture 800 of a user device, such as device 222 depicted in FIG. 2A, in accordance with various aspects of the presente disclosure. It will be appreciated that not all user devices will include all of the components of the architecture 800 and some user devices may include additional components not shown in the architecture 800. The architecture 800 may include one or more processing elements 804 for executing instructions and retrieving data stored in a storage element 802. The processing element 804 may comprise at least one processor. Any suitable processor or processors may be used. For example, the processing element 804 may comprise one or more digital signal processors (DSPs). In some examples, the processing element 804 may be effective to perform automatic volume leveling, as described herein. The storage element 802 can include one or more different types of memory, data storage, or computer-readable storage media devoted to different purposes within the architecture 800. For example, the storage element 802 may comprise flash memory, random-access memory, disk-based storage, etc. Different portions of the storage element 802, for example, may be used for program instructions for execution by the processing element 804, storage of images or other digital works, and/or a removable storage for transferring data to other devices, etc.

The storage element 802 may also store software for execution by the processing element 804. An operating system 822 may provide the user with an interface for operating the user device and may facilitate communications and commands between applications executing on the architecture 800 and various hardware thereof. A transfer application 824 may be configured to receive images, audio, and/or video from another device (e.g., a mobile device, image capture device, and/or display device) or from an image sensor 832 and/or microphone 870 included in the architecture 800. In some examples, the transfer application 824 may also be configured to send the received voice commands to a voice recognition server.

In some examples, storage element 802 may include an AVL component 826. AVL component 826 may be effective to analyze an audio signal to determine periods of noise and or silence. AVL component 826 may be further effective to perform the various calculations and processes described above in reference to FIGS. 1-7.

When implemented in some user devices, the architecture 800 may also comprise a display component 806. The display component 806 may comprise one or more light-emitting diodes (LEDs) or other suitable display lamps. Also, in some examples, the display component 806 may comprise, for example, one or more devices such as cathode ray tubes (CRTs), liquid-crystal display (LCD) screens, gas plasma-based flat panel displays, LCD projectors, raster projectors, infrared projectors or other types of display devices, etc.

The architecture 800 may also include one or more input devices 808 operable to receive inputs from a user. The input devices 808 can include, for example, a push button, touch pad, touch screen, wheel, joystick, keyboard, mouse, trackball, keypad, light gun, game controller, or any other such device or element whereby a user can provide inputs to the architecture 800. These input devices 808 may be incorporated into the architecture 800 or operably coupled to the architecture 800 via wired or wireless interface. In some examples, architecture 800 may include a microphone 870 or an array of microphones for capturing sounds, such as voice commands. Voice recognition engine 880 may interpret audio signals of sound captured by microphone 870. In some examples, voice recognition engine 880 may listen for a "wake-word" to be received by microphone 870. Upon receipt of the wake-word, voice recognition engine 880 may stream audio to a voice recognition server for analysis, as described above. In various examples, voice recognition engine 880 may stream audio to external computing devices via communication interface 812.

When the display component 806 includes a touch-sensitive display, the input devices 808 can include a touch sensor that operates in conjunction with the display component 806 to permit users to interact with the image displayed by the display component 806 using touch inputs (e.g., with a finger or stylus). The architecture 800 may also include a power supply 814, such as a wired alternating current (AC) converter, a rechargeable battery operable to be recharged through conventional plug-in approaches, or through other approaches such as capacitive or inductive charging.

The communication interface 812 may comprise one or more wired or wireless components operable to communicate with one or more other user devices (including, for example, mobile devices, tablet computers, display devices, and/or laptop computers, as well as other devices). For example, the communication interface 812 may comprise a wireless communication module 836 configured to communicate on a network according to any suitable wireless protocol, such as IEEE 802.11 or another suitable wireless local area network (WLAN) protocol. A short range interface 834 may be configured to communicate using one or more short range wireless protocols such as, for example, near field communications (NFC), Bluetooth, Bluetooth LE, etc. A mobile interface 840 may be configured to communicate utilizing a cellular or other mobile protocol. A Global Positioning System (GPS) interface 838 may be in communication with one or more earth-orbiting satellites or other suitable position-determining systems to identify a position of the architecture 800. A wired communication module 842 may be configured to communicate according to the USB protocol or any other suitable protocol.

The architecture 800 may also include one or more sensors 830 such as, for example, one or more position sensors, image sensors, and/or motion sensors. An image sensor 832 is shown in FIG. 8. Some examples of the architecture 800 may include multiple image sensors 832. For example, a panoramic camera system may comprise multiple image sensors 832 resulting in multiple images and/or video frames that may be stitched and may be blended to form a seamless panoramic output. An example of an image sensor 832 may be a camera configured to capture color information, image geometry information, and/or ambient light information.

Motion sensors may include any sensors that sense motion of the architecture including, for example, gyro sensors 844 and accelerometers 846. Motion sensors, in some examples, may be used to determine an orientation, such as a pitch angle and/or a roll angle, of a device of architecture 800. The gyro sensor 844 may be configured to generate a signal indicating rotational motion and/or changes in orientation of the architecture (e.g., a magnitude and/or direction of the motion or change in orientation). Any suitable gyro sensor may be used including, for example, ring laser gyros, fiber-optic gyros, fluid gyros, vibration gyros, etc. The accelerometer 846 may generate a signal indicating an acceleration (e.g., a magnitude and/or direction of acceleration). Any suitable accelerometer may be used including, for example, a piezoresistive accelerometer, a capacitive accelerometer, etc. In some examples, the GPS interface 838 may be utilized as a motion sensor. For example, changes in the position of the architecture 800, as determined by the GPS interface 838, may indicate the motion of the GPS interface 838. Infrared sensor 860 may be effective to determine a distance between a surface and the device including the infrared sensor 860. In some examples, the infrared sensor 860 may determine the contours of the surface and may be capable of using computer vision techniques to recognize facial patterns or other markers within the field of view of the infrared sensor 860's camera. In some examples, the infrared sensor 860 may include an infrared projector and camera. Processing element 804 may build a depth map based on detection by the infrared camera of a pattern of structured light displayed on a surface by the infrared projector. In some other examples, the infrared sensor 860 may include a time of flight camera that may compute distance based on the speed of light by measuring the time of flight of a light signal between a camera of the infrared sensor 860 and a surface. Further, in some examples, processing element 804 may be effective to determine the location of various objects in the physical environment within the field of view of a device of architecture 800 based on the depth map created by the infrared sensor 860. As noted above, in some examples, non-infrared depth sensors, such as passive stereo camera pairs, or non-identical camera pairs, may be used in place of, or in addition to, infrared sensor 860. Processing element 804 may be effective to determine the location of various objects in the physical environment within the field of view of a camera of architecture 800 based on the depth map created by one or more non-infrared depth sensors.

Figure 9:
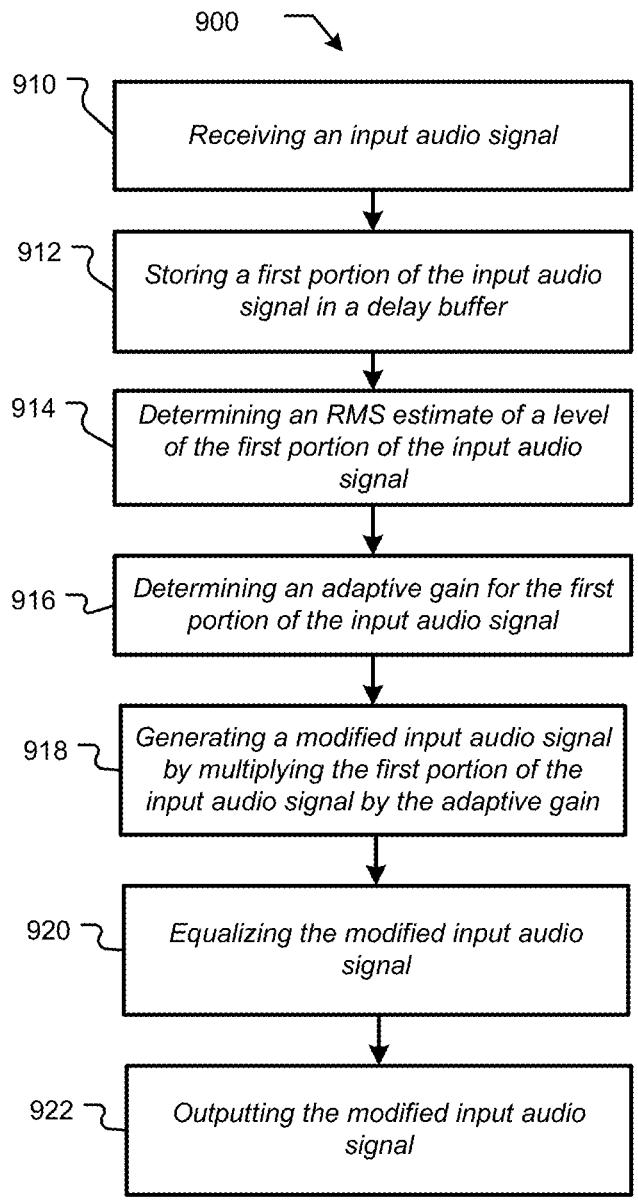
FIG. 9 depicts a flow chart showing an example process for automatic volume leveling of a received audio signal, in accordance with various aspects of the present disclosure.

FIG. 9 is a flow chart showing an example process for automatic volume leveling of a received audio signal, in accordance with various aspects of the present disclosure. The process flow 900 of FIG. 9 may be executed by device 222 and/or by some other computing device such as the various computing architectures described in reference to FIG. 8, in accordance with various aspects of the present disclosure. The actions of process flow 900 may represent a series of instructions comprising computer-readable machine code executable by a processing unit of a computing device. In various examples, the computer-readable machine code may be comprised of instructions selected from a native instruction set of the computing device and/or an operating system of the computing device. Various actions in process flow 900 may be described with reference to elements of FIGS. 1-8.

At action 910 of process flow 900, an input audio signal may be received. For example, an audio signal representing a music stream, a voice input detected by a microphone, a text to speech (TTS) signal, and/or another type of audio signal may be received by a device, such as device 222 depicted in FIG. 2A.

Processing may continue from action 910 to action 912, wherein a first portion of the input audio signal may be stored in a delay buffer. For example, as depicted in FIG. 1, an audio block, one or more samples, or some other portion of an audio signal may be stored in a delay buffer, such as a look-ahead buffer in action 112 of FIG. 1. Processing may be concurrently performed on the stored portion of the received audio signal. The portion of the audio signal may thereafter be altered, as described using the various techniques discussed herein, and output. Advantageously, delaying the portion of the audio signal in the delay buffer may avoid sudden and drastic changes in playback due to erratic and/or significant level changes in the input audio stream.

Processing may continue from action 912 to action 914, "Determining an RMS estimate of a level of the first portion of the input audio signal." At action 914, an RMS estimate of the level of the first portion of the input audio signal may be determined. In various examples, a K2-weighting filter may be used to filter the received audio signal. Thereafter, the audio signal may be high pass filtered with a cutoff frequency of the high pass filter being tailored to a particular loudspeaker associated with the automatic volume leveling process being performed. Thereafter, an RMS level estimate may be generated using, for example, equation (2) above. The RMS level estimate may depend on an RMS level estimate for a previous audio block in order to provide a consistent signal level.

Processing may continue from action 914 to action 916, "Determining an adaptive gain for the first portion of the input audio signal." At action 916, an adaptive gain (sometimes referred to herein as a "variable gain") may be determined for the portion of the input audio signal stored in the delay buffer. For example, the RMS level estimate generated at action 914 may be used as an input to a function representing the static level curve depicted in FIG. 5. As depicted in FIG. 5, as the RMS level of the input audio signal increases over time toward 0.0 dB the gain varies. Different thresholds may be used to determine different adaptive gain characteristics. In various other examples, determining the adaptive gain may be performed as a lookup operation with the estimated RMS level being used as a search input to determine a gain associated with the particular RMS level estimate.

Processing may continue from action 916 to action 918, "Generating a modified input audio signal by multiplying the first portion of the input audio signal by the adaptive gain." At action 918, a modified input audio signal may be generated by multiplying the portion of the received audio signal stored in the delay buffer by the adaptive gain determined at action 916. In various examples, a different adaptive gain may be determined for each channel of an input audio signal. Accordingly, the automatic volume leveling techniques described herein may be used independent of the number of channels of a particular audio input. In some examples, the gain may be smoothed using a smoothing function prior to multiplying the adaptive gain with the portion of the input audio signal stored in the delay buffer. Additionally, in various examples, a limiter may be used to avoid clipping of the modified input audio signal.

Processing may continue from action 918 to action 920, "Equalizing the modified input audio signal." At action 920 the modified input audio signal may be equalized according to the frequency response of the particular loudspeaker which will output the modified input audio signal. EQing the signal after performing the automatic volume leveling techniques allows the techniques described herein to be easily adapted to any speaker.

Processing may continue from action 920 to action 922, "Outputting the modified input audio signal." At action 922, the modified input audio signal may be output on one or more loudspeakers and/or may be sent to a voice recognition server, wake-word engine or other computing device for further processing.

Among other potential benefits, a system in accordance with the present disclosure may allow for automatic volume leveling for any loudspeaker and/or set of loudspeakers, for any number of channels (e.g., mono, stereo, 5.1, 7.1, etc.), at any sampling rate (e.g., 48 kHz, 44.1 kHz, 32 kHz, 24 kHz, 22.05 kHz, 16 kHz, 11.025 kHz, and/or 8 kHz). The various techniques for automatic volume leveling described above can offer a listener a consistent and balanced sonic experience with high audio quality due to the accuracy of the loudness measurement using the techniques described herein. Additionally, the automatic volume leveling techniques described herein may adjust the input audio signal to balance level changes to avoid inconsistent loudness between songs and/or various other types of input audio. Breathing and pumping problems typically associated with dynamic range compression are also avoided using the automatic volume leveling techniques described herein. Further, the various techniques described herein may maximize audio performance and automatic speech recognition performance by distinguishing between various types of input audio signals and using various signal processing techniques tailored to the particular type of input audio signal detected.

Although various systems described herein may be embodied in software or code executed by general purpose hardware as discussed above, as an alternate the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those of ordinary skill in the art and consequently, are not described in detail herein.

The flowcharts and methods described herein show the functionality and operation of various implementations. If embodied in software, each block or step may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processing component in a computer system. If embodied in hardware, each block may represent a circuit or a number of interconnected circuits to implement the specified logical function(s).

Although the flowcharts and methods described herein may describe a specific order of execution, it is understood that the order of execution may differ from that which is described. For example, the order of execution of two or more blocks or steps may be scrambled relative to the order described. Also, two or more blocks or steps may be executed concurrently or with partial concurrence. Further, in some embodiments, one or more of the blocks or steps may be skipped or omitted. It is understood that all such variations are within the scope of the present disclosure.

Also, any logic or application described herein that comprises software or code can be embodied in any non-transitory computer-readable medium or memory for use by or in connection with an instruction execution system such as a processing component in a computer system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as magnetic, optical, or semiconductor media. More specific examples of a suitable computer-readable media include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described example(s) without departing substantially from the spirit and principles of the disclosure. All such modifications and variations are intended to be included herein within the scope of this disclosure and protected by the following claims.

What is claimed is:

1. A method of automatic volume leveling, the method comprising:
   receiving, by an audio device, an audio signal;
   receiving, by the audio device, indicator data indicating that the audio signal is of a first type;
   determining a volume index value of the audio device, wherein the volume index value is a user-selected volume setting of the audio device;
   determining a first gain of the audio signal, wherein the first gain is determined by using the volume index value to lookup the first gain in a volume curve table for signals of the first type;
   determining an estimated root mean square (RMS) value of a first portion of the audio signal using a formula: $x^2_{rms}(n)=(1-k)\cdot x^2_{rms}(n-1)+k\cdot[x(n)]^2$ where $x^2_{rms}(n-1)$ represents a previous estimated RMS value for a previous portion of the audio signal sampled prior to the first portion, $x(n)$ represents the first portion of the audio signal, and $k=1-\exp(-2.2/(fs*t/1000))$, where t is a time constant in milliseconds, and fs is a sampling rate of the audio signal;
   determining a second gain of the first portion of the audio signal, wherein the second gain is determined by using the estimated RMS value of the first portion to lookup the second gain on a static level curve of input level versus gain;
   generating a modified first portion of the audio signal by multiplying the first portion of the audio signal by the second gain;
   equalizing the modified first portion of the audio signal by reducing an audio level for a first frequency range of the modified first portion of the audio signal to reduce an output level of a loudspeaker at the first frequency range; and
   outputting the modified first portion of the audio signal to the loudspeaker.

2. The method of claim 1, further comprising:
   determining an energy level of a second portion of the audio signal;
   determining that the energy level of the second portion is less than a noise threshold energy level, wherein energy levels below the noise threshold energy level are classified as noise; and
   setting a second estimated RMS value of the second portion of the audio signal equal to the previous estimated RMS value of the audio signal to maintain a current gain for the second portion of the audio signal.

3. The method of claim 1, further comprising selecting the static level curve from among a plurality of static level curves, wherein the selected static level curve corresponds to the first type.

4. The method of claim 1, further comprising:
   modifying the second gain using an equation $g(n)=\alpha*g(n-1)+(1-\alpha)*second\_gain$ to generate a modified second gain, where $\alpha$ is a smoothing factor between 0 and 1, $g(n-1)$ is a previous gain of the audio signal, second_gain is the second gain, and $g(n)$ is the modified second gain, wherein the second gain is modified prior to multiplying the first portion of the audio signal by the second gain.

5. A method, comprising:
   receiving an audio signal;
   determining a type of the audio signal;
   determining a volume index of an audio device comprising a loudspeaker;
   determining a first volume curve, from among a plurality of volume curves, corresponding to the type of the audio signal;
   determining an input gain of the audio signal, the input gain corresponding to the volume index in the first volume curve;
   generating an updated audio signal by multiplying the audio signal by the input gain;
   storing a first portion of the updated audio signal in a delay buffer;
   determining a root mean square (RMS) estimate of the first portion of the updated audio signal, wherein the RMS estimate is determined based at least in part on a second portion of the updated audio signal previous to the first portion;
   generating a modified audio signal by multiplying the first portion of the updated audio signal by a variable gain, wherein the variable gain is based at least in part on the RMS estimate; and
   sending the modified audio signal to the audio device.

6. The method of claim 5, wherein the variable gain is determined using the RMS estimate as an input to a gain determination function, wherein the gain determination function determines the variable gain such that:
   first RMS estimate input levels less than a first input level are associated with a linear amplification using a constant positive gain;
   second RMS estimate input levels between the first input level and a second input level are associated with a linearly decreasing amount of positive gain from the constant positive gain at the first input level to a unity gain of 0.0 dB at the second input level;
   third RMS estimate input levels between the second input level and a third input level are associated with the unity gain;

fourth RMS estimate input levels between the third input level and a fourth input level are associated with a linearly increasing amount of negative gain from the unity gain at the third input level to a constant negative gain at the fourth input level; and fifth RMS estimate input levels between the fourth input level and 0.0 dB are associated with attenuation using the constant negative gain.

7. The method of claim 5, further comprising:
determining that a third portion of the updated audio signal represents noise; and
setting a second RMS estimate of the third portion to a third RMS estimate of a fourth portion of the updated audio signal, wherein the fourth portion immediately precedes the third portion.

8. The method of claim 5, wherein determining the RMS estimate comprises attenuating one or more frequencies of the first portion of the audio signal that are less than about 50 Hz.

9. The method of claim 5, further comprising:
after generating the modified audio signal, equalizing the modified audio signal by reducing an audio level for a first frequency range of the modified audio signal, wherein the first frequency range is determined based at least in part on a frequency response of the loudspeaker.

10. The method of claim 5, further comprising:
receiving a second audio signal;
determining that the second audio signal is one or more of the following: an alarm signal, a timer signal, or a Volume-Attenuated signal; and
outputting the second audio signal without modifying a gain of the second audio signal.

11. The method of claim 5, further comprising:
receiving a second audio signal, wherein the second audio signal comprises at least two channels;
determining a second RMS estimate of a portion of the second audio signal for a first channel, wherein the second RMS estimate is determined based at least in part on a previous portion of the second audio signal for the first channel;
determining a third RMS estimate of the portion of the second audio signal for a second channel, wherein the third RMS estimate is determined based at least in part on a previous portion of the second audio signal for the second channel;
generating a second modified audio signal by multiplying the portion of the second audio signal for the first channel by a second variable gain, wherein the second variable gain is based at least in part on the second RMS estimate;
generating a third modified audio signal by multiplying the portion of the second audio signal for the second channel by a third variable gain, wherein the third variable gain is based at least in part on the third RMS estimate; and
sending at least one of the second modified audio signal and the third modified audio signal to the loudspeaker.

12. The method of claim 5, further comprising:
determining the RMS estimate of the first portion of the updated audio signal using a formula: $x^2_{rms}(n)=(1-k) \cdot x^2 rms\ (n-1)+k \cdot [x(n)]^2$ where $x^2 rms\ (n-1)$ represents a previous RMS estimate for a previous portion of the updated audio signal sampled prior to the first portion, $x(n)$ represents the first portion of the updated audio signal, and $k=1-\exp(-2.2/(fs*t/1000))$, where $t$ is a time constant in milliseconds, and $fs$ is a sampling rate of the updated audio signal.

13. The method of claim 5, further comprising:
prior to determining the RMS estimate, estimating an envelope of the first portion of the updated audio signal using a compressor;
estimating a noise floor of the first portion of the updated audio signal;
determining a ratio between the envelope and the noise floor; and
determining that the first portion of the updated audio signal represents noise based at least in part on the ratio.

14. A computing device comprising:
at least one processor;
a non-transitory computer-readable memory storing instructions that when executed by the at least one processor are effective to perform a method comprising:
receiving an audio signal;
determining a type of the audio signal;
determining a volume index of an audio device comprising a loudspeaker;
determining a first volume curve, from among a plurality of volume curves, corresponding to the type of the audio signal;
determining an input gain of the audio signal, the input gain corresponding to the volume index in the first volume curve;
generating an updated audio signal by multiplying the audio signal by the input gain;
storing a first portion of the updated audio signal in a delay buffer;
determining a root mean square (RMS) estimate of the first portion of the updated audio signal, wherein the RMS estimate is determined based at least in part on a second portion of the updated audio signal previous to the first portion;
generating a modified audio signal by multiplying the first portion of the updated audio signal by a variable gain, wherein the variable gain is based at least in part on the RMS estimate; and
sending the modified audio signal to the audio device.

15. The computing device of claim 14, wherein the instructions, when executed by the at least one processor, are effective to cause the at least one processor to perform the method further comprising:
determining the variable gain using the RMS estimate as an input to a gain determination function, wherein the gain determination function determines the variable gain such that:
first RMS estimate input levels less than a first input level are associated with a linear amplification using a constant positive gain;
second RMS estimate input levels between the first input level and a second input level are associated with a linearly decreasing amount of positive gain from the constant positive gain at the first input level to a unity gain of 0.0 dB at the second input level;
third RMS estimate input levels between the second input level and a third input level are associated with the unity gain;
fourth RMS estimate input levels between the third input level and a fourth input level are associated with a linearly increasing amount of negative gain from the unity gain at the third input level to a constant negative gain at the fourth input level; and fifth RMS estimate input levels between the fourth input level and 0.0 dB are associated with attenuation using the constant negative gain.

16. The computing device of claim 14, wherein the instructions, when executed by the at least one processor, are effective to cause the at least one processor to perform the method further comprising:
    determining that a third portion of the updated audio signal represents noise; and
    setting a second RMS estimate of the third portion to a third RMS estimate of a fourth portion of the updated audio signal, wherein the fourth portion immediately precedes the third portion.

17. The computing device of claim 14, wherein the instructions, when executed by the at least one processor, are effective to cause the at least one processor to perform the method further comprising:
    after generating the modified audio signal, equalizing the modified audio signal by reducing an audio level for a first frequency range of the modified audio signal, wherein the first frequency range is determined based at least in part on a frequency response of the loudspeaker.

18. The computing device of claim 14, wherein the instructions, when executed by the at least one processor, are effective to cause the at least one processor to perform the method further comprising:
    receiving a second audio signal;
    determining that the second audio signal is one or more of the following: an alarm signal, a timer signal, or a Volume-Attenuated signal; and
    outputting the second audio signal without modifying a gain of the second audio signal.

19. The computing device of claim 14, wherein the instructions, when executed by the at least one processor, are effective to cause the at least one processor to perform the method further comprising:
    determining the RMS estimate of the first portion of the updated audio signal using a formula: $x^2_{rms}(n)=(1-k) \cdot x^2_{rms}(n-1)+k \cdot [x(n)]^2$ where $x^2_{rms}(n-1)$ represents a previous RMS estimate for a previous portion of the updated audio signal sampled prior to the first portion, $x(n)$ represents the first portion of the updated audio signal, and $k=1-\exp(-2.2/(fs*t/1000))$, where t is a time constant in milliseconds, and fs is a sampling rate of the updated audio signal.

20. The computing device of claim 14, wherein the instructions, when executed by the at least one processor, are effective to cause the at least one processor to perform the method further comprising:
    prior to determining the RMS estimate, estimating an envelope of the first portion of the updated audio signal using a compressor;
    estimating a noise floor of the first portion of the updated audio signal;
    determining a ratio between the envelope and the noise floor; and
    determining that the first portion of the updated audio signal represents noise based at least in part on the ratio.

* * * * *